US009773816B2

(12) United States Patent
Cai

(10) Patent No.: US 9,773,816 B2
(45) Date of Patent: Sep. 26, 2017

(54) PIXEL UNIT, ARRAY SUBSTRATE AND LIQUID CRYSTAL DISPLAY

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Peizhi Cai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 60 days.

(21) Appl. No.: 14/361,950

(22) PCT Filed: Dec. 12, 2013

(86) PCT No.: PCT/CN2013/089304
§ 371 (c)(1),
(2) Date: May 30, 2014

(87) PCT Pub. No.: WO2015/035725
PCT Pub. Date: Mar. 19, 2015

(65) Prior Publication Data
US 2015/0070615 A1    Mar. 12, 2015

(30) Foreign Application Priority Data
Sep. 10, 2013    (CN) .......................... 2013 1 0410129

(51) Int. Cl.
*G02F 1/136*    (2006.01)
*H01L 27/12*    (2006.01)
(Continued)

(52) U.S. Cl.
CPC .......... *H01L 27/124* (2013.01); *G02F 1/1368* (2013.01); *G02F 1/13624* (2013.01);
(Continued)

(58) Field of Classification Search
CPC .......... G02F 1/13624; G02F 1/134336; G02F 2001/136245; G02F 2001/134345
See application file for complete search history.

(56) References Cited

U.S. PATENT DOCUMENTS 6,839,117 B1    1/2005 Park et al.
2005/0128407 A1*  6/2005 Lee ................... G02F 1/134363
349/141
(Continued)

FOREIGN PATENT DOCUMENTS

CN    101398587 A    4/2009
CN    102156367 A    8/2011
CN    203519984 U    4/2014

OTHER PUBLICATIONS

International Search Report Issued Jun. 23, 2014; Appln. No. PCT/CN2013/089304.
(Continued)

*Primary Examiner* — Phu Vu
(74) *Attorney, Agent, or Firm* — Ladas & Parry LLP

(57) ABSTRACT

A pixel unit, an array substrate and a LCD device including the array substrate are disclosed. The pixel unit includes a scan line, a signal line, a slit electrode, a coupling electrode cooperated with the slit electrode to generate an electric field, and a thin film transistor, a plurality of slits are formed on the slit electrode. The scan line and the signal line are intersected and overlapped with each other to define at least two sub-regions. The coupling electrode comprises at least two sub-electrodes respectively located in the at least two sub-regions. The slit electrode corresponds to all of the sub-regions and slits in different sub-regions extend along different directions.

11 Claims, 2 Drawing Sheets

(51) Int. Cl.
*G02F 1/1368* (2006.01)
*G02F 1/1362* (2006.01)
*G02F 1/1343* (2006.01)

(52) U.S. Cl.
CPC .. *G02F 1/134309* (2013.01); *G02F 1/136209* (2013.01); *G02F 2001/134345* (2013.01); *G02F 2001/136222* (2013.01)

(56) References Cited

U.S. PATENT DOCUMENTS

| | | |
|---|---|---|
| 2009/0086149 A1 | 4/2009 | Kim |
| 2010/0128192 A1 | 5/2010 | Kim et al. |
| 2012/0033149 A1 | 2/2012 | Song et al. |
| 2012/0194776 A1 | 8/2012 | Tanaka et al. |
| 2012/0307172 A1* | 12/2012 | Yoshida ............ G02F 1/133707 349/43 |

OTHER PUBLICATIONS

International Preliminary Report on Patentability Appln. No. PCT/CN2013/08930; Dated Mar. 15, 2016.
First Chinese Office Action dated Nov. 2, 2016; Appln. No. 201310410129.5.
The Second Chinese Office dated Jun. 9, 2017; Appln. No. 201310410129.5.

* cited by examiner

PIXEL UNIT, ARRAY SUBSTRATE AND LIQUID CRYSTAL DISPLAY

FIELD OF THE ART

Embodiments of the invention relate to the field of liquid crystal display technologies, more particularly, to a pixel unit, an array substrate and a liquid crystal display (LCD).

BACKGROUND

Currently, a pixel unit of a Thin Film Transistor Liquid Crystal Display (TFT-LCD) may correct color cast through self-compensation of liquid crystals. However, such a method only widens the viewing angles to a limited extent, and it does not effectively widen the viewing angles at various directions. Moreover, the gate/source parasitic capacitance in a known pixel unit may be easily changed with process deviations, which causes jumping voltages at different display regions to be different. As a result, defects such as flicker or image sticking may occur, which compromises the product quality.

SUMMARY

An objective of the invention is to provide a pixel unit, an array substrate and a LCD, which correct the color cast and increase the display quality.

To achieve the above objective, technical solutions of the invention are implemented in the following way.

A first aspect of the disclosure provides pixel unit. It comprises a scan line, a signal line, a slit electrode, a coupling electrode cooperated with the slit electrode to generate an electric field, and a thin film transistor (TFT), a plurality of slits are formed on the slit electrode. The scan line and the signal line are intersected and overlapped with each other to define at least two sub-regions. The coupling electrode comprises at least two sub-electrodes respectively located in the at least two sub-regions. The slit electrode corresponds to all of the sub-regions and slits in different sub-regions extend along different directions.

As an example, the TFT comprises an active layer disposed above and insulated from the scan line, the TFT further comprises a drain electrode disposed above the scan line and having an orthographic projection totally falling into the scan line; the signal line is disposed above and connected to the active layer, the signal line functions as a source electrode.

As an example, a portion of the scan line which corresponds to the TFT is widened from one side or both sides.

As an example, two sub-electrodes of the at least two sub-electrodes are disposed on a same side of the signal line and connected by a connection bridge in a same layer as the two sub-electrodes; the drain electrode is connected to the connection bridge.

As an example, both the TFT and the two sub-electrodes connected by way of a connection bridge are disposed on each side of the signal line, and the drain electrode of each TFT is connected to the connection bridge.

As an example, the pixel unit is symmetrical with regard to the scan line and the signal line.

As an example, the coupling electrode is a pixel electrode, and the slit electrode is a common electrode.

A second aspect of the invention further provides an array substrate comprising the above pixel unit.

A third aspect of the invention further provides a LCD device comprising the above array substrate.

As an example, the LCD device further comprises a color filter substrate. The color filter substrate comprises a black matrix, the black matrix overlays a gap between the pixel units and further overlays both the scan line and the signal line in the pixel unit.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

Figure 1:
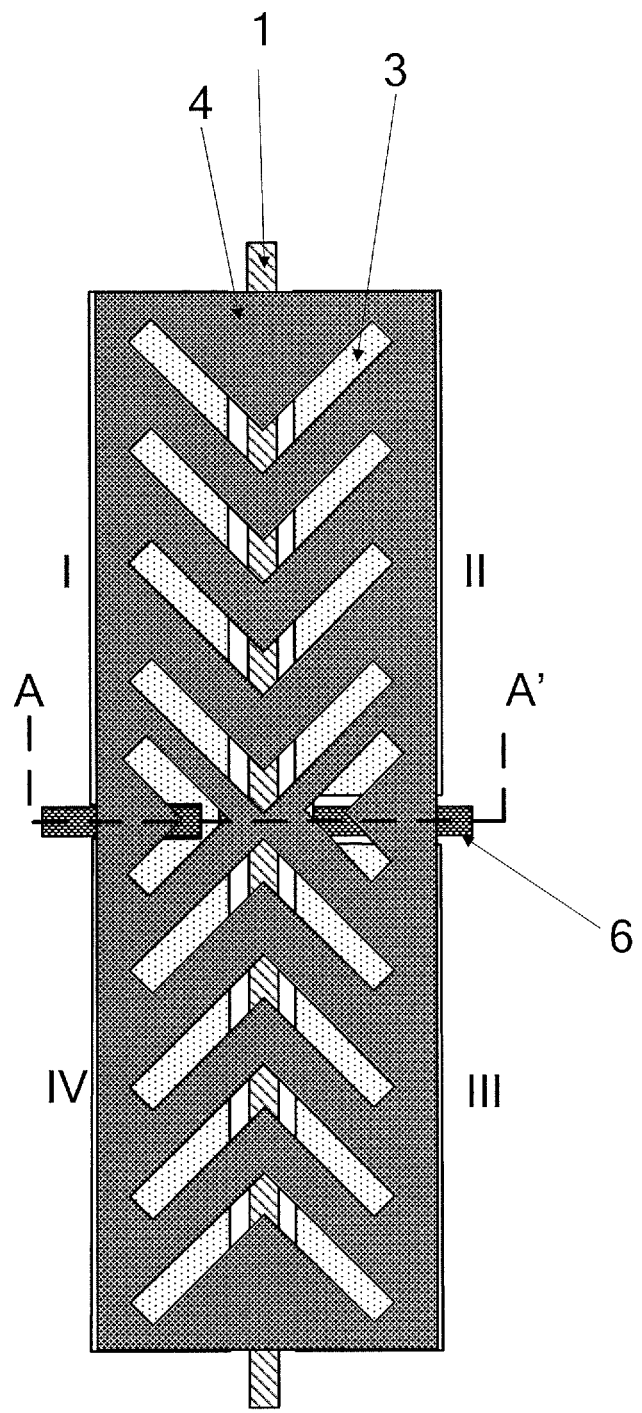
FIG. 1 schematically illustrates a pixel unit in accordance with an embodiment of the invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Thicknesses and shapes of respective film layers in the drawings are used to illustrate and depict the disclosure instead of reflecting actual proportions of an array substrate.

An embodiment of the invention provides a pixel unit. The pixel unit comprises a scan line 6, a signal line 1, a slit electrode 4, a coupling electrode 3 and a TFT. The coupling electrode 3 cooperates with the slit electrode 4 in generating an electric field, and a plurality of slits are formed on the slit electrode 4. The scan line 6 and the signal line 1 are intersected and overlapped with each other, which defines at least two sub-regions (for example four sub-regions I, II, III, IV, as illustrated in FIG. 1). The coupling electrode 3 comprises at least two sub-electrodes, each of which is located in one of the sub-regions. The slit electrode 4 corresponds to all of the sub-regions (that is, overlaying all the sub-regions) and slits in different sub-regions extend along different directions (for example, if the scan line 6 is defined as X axis, angles between an extending direction of the respective slit in the four regions I, II, III, IV of FIG. 1 and the X axis are for example +45°, +135°, +225° (or −135°) and +315° (or −45°), respectively.

Generally, the coupling electrode and the slit electrode are exchangeable. In the embodiment of the invention, an example of the coupling electrode 3 being the pixel electrode and the slit electrode 4 being the common electrode will be described.

The TFT comprises an active layer 2 disposed above and insulated from the scan line 6. The TFT further comprises a source electrode 5 disposed above the scan line 6 and having an orthographic projection totally falling into the scan line 6. The signal line 1 is disposed above and connected to the active layer 2. In this case, the signal line 1 functions as the drain electrode.

Figure 2:
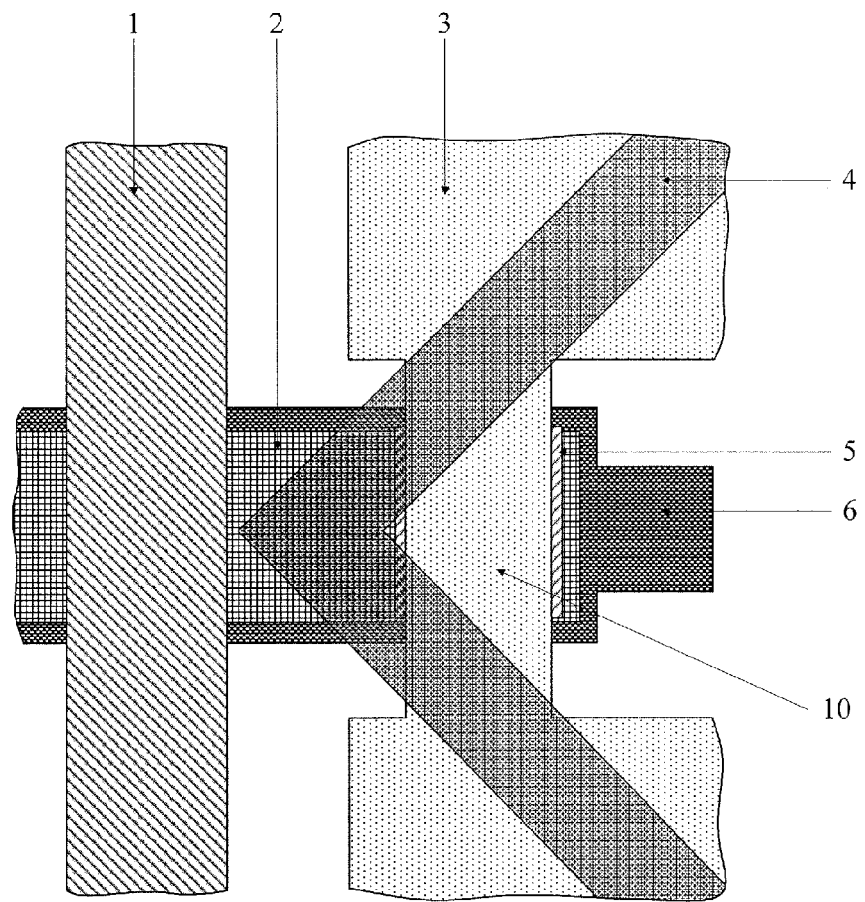
FIG. 2 is a partial enlarged perspective view schematically illustrates an intersection between a scan line and a signal line of FIG. 1.

With reference to FIG. 2, to solve the problem of shift of the coupling capacitance (Cgs) between the gate electrode and the source electrode 5 caused by process deviations, the source electrode 5 may be deposited above the scan line 6, that is, the scan line 6 partially functions as the gate electrode. Such a pixel unit with Cgs self-compensation function stabilizes Cgs values in different regions, thereby guaranteeing the uniformity of jumping voltages, and effectively improving the product quality. Moreover, the coupling electrode 3 may be connected to the source electrode 5 by way of a connection bridge 10, without the need for a via hole, so as to improve the defect-free rate of the products.

In case that the source electrode and the drain electrode are exchanged, the TFT comprises an active layer 2 disposed above and insulated from the scan line 6. The TFT further comprises a drain electrode disposed above the scan line 6 and having an orthographic projection totally falling into the scan line 6. The signal line 1 is disposed above and connected to the active layer 2. In this case, the signal line 1 functions as the source electrode.

It is seen that the whole of drain electrode are fabricated above the scan line 6, therefore the fabrication deviation in disposition of the drain electrode normally will not affect an overlapping area between the drain electrode and the gate electrode, thereby ensuring that parasitic capacitances between the gate electrodes and the drain electrodes of individual TFTs are same as one another, which will eventually guaranteeing the uniformity of the display quality of the respective display units.

It is also seen from FIG. 2 that a portion of the scan line 6 which corresponds to the TFTs are widened from one side or both sides. By this means, the width-to-length ratio of the TFT can be increased when the channel width remains the same, thereby improving the charging performance of the TFTs.

Furthermore, two sub-electrodes driven by the same TFT may be electrically connected by way of a connection bridge 10 in the same layer as the two sub-electrodes; the drain electrode is connected to the connection bridge 10. For example, there are two sub-electrodes disposed on the same side of the signal line 1, and the two sub-electrodes are electrically connected by way of the connection bridge 10 in the same layer as the two sub-electrodes. It can be contemplated that both the TFT and the two sub-electrodes connected by way of a connection bridge 10 are disposed on each side of the signal line 1, and the drain electrode of each TFT is connected to the connection bridge 10.

As illustrated in FIG. 2, a width of the connection bridge 10 is for example smaller than that of the coupling electrode 3; it may also be the same as the width of the coupling electrode 3.

In practical applications, different sub-electrodes of the coupling electrode 3 may be separately disposed, instead of being formed as an integral body. For different sub-electrodes, they may be driven by the same TFT or driven by different TFTs, such that one TFT may drive one or at least two sub-electrodes. In this way, the viewing angles at different directions are widened, the color cast is effectively eliminated, and the aperture ratio is effectively increased, thereby significantly improving the display quality.

The pixel unit of FIG. 1 is symmetrical with respect to the scan line 6 and the signal line 1, thereby making the image display quality better.

The coupling electrode 3 is generally a pixel electrode, and the slit electrode 4 is generally a common electrode. It can be contemplated that the coupling electrode and the slit electrode may be exchangeable.

An embodiment of the invention further provides an array substrate comprising the above pixel unit. For example, the above pixel unit may be embodied on a glass substrate to form an array substrate, though the substrate of the disclosure is not limited to the glass substrate.

An embodiment of the invention further provides a LCD device comprising the above array substrate.

Moreover, due to the interaction of liquid crystals, the orientation of the liquid crystals are disordered at interfaces between different sub-electrodes, thus, the following shielding configuration is provided:

a black matrix layer overlaying interfaces between different sub-electrodes of the coupling electrode 3 is disposed on a color filter substrate, and the color filter substrate is assembled with the array substrate having the pixel unit of the disclosure embodied thereon to form a cell; as an example, the black matrix overlays both the scan line 6 and the signal line 1 in the pixel unit.

The above shielding configuration effectively optimizes the disordered state of the orientations of the liquid crystal molecules at the interfaces between different sub-electrodes, thereby improving the display quality.

The black matrix further overlays a gap between the pixel units.

Furthermore, overlapping portions between the slit electrode 4 and the scan line 6 or the signal line 1 may be removed, to reduce the overlapping area between the slit electrode 4 and the scan line 6 or the signal line 1, thereby further effectively reducing the coupling capacitance and the power consumption.

In practical applications, there may be many configurations, such as that in FIG. 1, based on the above description. As the active layer 2 and the source electrode 5 of FIG. 2 are covered in FIG. 1, they are not shown in FIG. 1. In FIG. 1, the scan line 6 and the signal line 1 intersect and overlap with each other to define four sub-regions. The coupling electrode 3 comprises four sub-electrodes respectively disposed in the four sub-regions. It can be contemplated that if the scan line 6 or the signal line 1 is positioned at an edge of the pixel unit of FIG. 1, the scan line 6 and the signal line 1 will intersect and overlap with each other to define two sub-regions.

The pixel unit of FIG. 1 is symmetrical with respect to the scan line 6 and the signal line 1, making the image display quality better. The coupling electrode 3 comprises four centrosymmetric sub-electrodes, making the coupling electrode 3 symmetrical along both the X and Y directions. That is, for a portion of the coupling electrode 3 divided by a vertical center line (i.e., left portion or right portion), the portion is symmetrical about the horizontal center line; for a portion of the coupling electrode 3 divided by a horizontal center line (i.e., upper portion or lower portion), the portion is symmetrical about the vertical center line. Such a configuration widens the viewing angle from four directions, thereby effectively eliminating the color cast and remarkably improving the display quality.

Furthermore, the signal line 1 and the scan line 6 are disposed at interfaces between different sub-electrodes of the coupling electrode 3. For example, the signal line 1 is disposed along the vertical center line of the coupling electrode 3 vertically, and the scan line 6 is disposed along the horizontal center line of the coupling electrode 3 horizontally.

Among the four sub-electrodes comprised in the coupling electrode 3, a TFT may be configured for two of the sub-electrodes, and another TFT configured for the other two sub-electrodes, such that each TFT drives two sub-electrodes, thereby improving the aperture ratio. As an example, for the two sub-electrode on left side and the two sub-electrode on right side of the coupling electrode 3 divided by the signal line 1, a TFT may be configured for the two sub-electrodes on the left side of the signal line 1, and a further TFT configured for the two sub-electrodes on the right side of the signal line 1. Alternatively, for the two sub-electrode on upper side and the two sub-electrode on lower side of the coupling electrode 3 divided by the scan line 6, a TFT may be configured for the two sub-electrodes on the upper side of the scan line 6, and a further TFT configured for the two sub-electrodes on the lower side of the scan line 6.

Generally, the two TFTs are in the same state. A detailed connection between the sub-electrodes and the TFTs is illustrated in FIG. 2. The configuration of FIG. 2 may be formed by using a regular 5 mask process, which mainly comprises the steps of:

(1) depositing a gate electrode metal on a glass substrate 9 and forming a gate line;

(2) sequentially depositing a plurality of film layers: GI, a-Si, and n+a-Si;

(3) depositing SD metal, and forming a signal line 1 and a TFT channel;

(4) depositing a first ITO layer, and forming a coupling electrode 3;

(5) depositing a PVX layer; and (6) depositing a second ITO layer, and forming a slit electrode 4.

Figure 3:
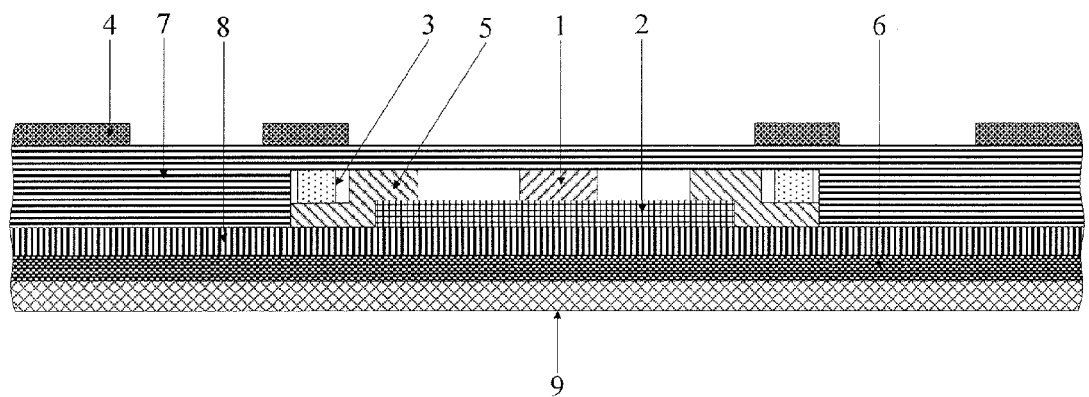
FIG. 3 schematically illustrates a cross section taken along A-A' of the pixel unit of FIG. 1.

It is noted that there are many other methods for forming the configuration of FIG. 2; the above is only a description by taking FIG. 3 as an example. Furthermore, the source electrode 5 and the signal line 1 functioning as the drain electrode are exchangeable.

In summary, the pixel unit and the array substrate as well as the LCD device comprising the array substrate in accordance with the embodiments of the invention comprise a scan line, a signal line, a slit electrode, a coupling electrode cooperated with the slit electrode to generate an electric field, and a TFT; a plurality of slits are formed on the slit electrode; the scan line and the signal line are intersected and overlapped with each other to define at least two sub-regions; the coupling electrode comprises at least two sub-electrodes respectively located in at least two sub-regions; the slit electrode corresponds to all of the sub-regions and slits in different sub-regions extend along different directions. As a result, the viewing angles at different directions are widened, which effectively correct the color cast and increase the aperture ratio in comparison with the conventional art, thereby remarkably improving the display quality.

What are described above is related to the illustrative embodiments of the disclosure only and not limitative to the scope of the disclosure; the scopes of the disclosure are defined by the accompanying claims.

What is claimed is:

1. A pixel unit, comprising a scan line, a signal line, a slit electrode, a coupling electrode cooperated with the slit electrode to generate an electric field, and two thin film transistors (TFTs), a plurality of slits are formed on the slit electrode;

wherein the scan line and the signal line are intersected and overlapped with each other to define four sub-regions, the coupling electrode comprises four sub-electrodes respectively located at different sides of the signal line and in the four sub-regions; the slit electrode corresponds to all of the sub-regions and slits in different sub-regions extend along different directions;

the slit electrode covers the four sub-regions and covers the scan line and the signal line interposed between the four sub-regions;

the two TFTs are disposed at the different sides of the signal line, and each of the TFTs comprises: an active layer disposed above and insulated from the scan line, and a drain electrode disposed above the scan line and having an orthographic projection totally falling into the scan line; the signal line is disposed above and connected to the active layer and functions as a source electrode; and two sub-electrodes of the four sub-electrodes are disposed on a same side of the signal line and connected by a connection bridge in a same layer as the two sub-electrodes, and the drain electrode of the TFT on the same side of the signal line is connected to the connection bridge.

2. The pixel unit of claim 1, wherein a portion of the scan line which corresponds to the TFT is widened from one side or both sides.

3. The pixel unit of claim 1, wherein the pixel unit is symmetrical with regard to the scan line and the signal line.

4. The pixel unit of claim 1, wherein the coupling electrode is a pixel electrode, and the slit electrode is a common electrode.

5. An array substrate comprising the pixel unit of claim 1.

6. A liquid crystal display device comprising the array substrate of claim 5.

7. The liquid crystal display device of claim 6, further comprising a color filter substrate; the color filter substrate comprises a black matrix, the black matrix overlays a gap between the pixel units and further overlays both the scan line and the signal line in the pixel unit.

8. The pixel unit of claim 2, wherein the pixel unit is symmetrical with regard to the scan line and the signal line.

9. The array substrate of claim 5, wherein a portion of the scan line which corresponds to the TFT is widened from one side or both sides.

10. The array substrate of claim 5, wherein the pixel unit is symmetrical with regard to the scan line and the signal line.

11. The array substrate of claim 5, wherein the coupling electrode is a pixel electrode, and the slit electrode is a common electrode.

* * * * *